United States Patent [19]

Ueda et al.

[11] Patent Number: 5,606,193
[45] Date of Patent: Feb. 25, 1997

[54] DRAM AND MROM CELLS WITH SIMILAR STRUCTURE

[75] Inventors: Naoki Ueda, Nara; Yoshimitsu Yamauchi, Nabari; Kenichi Tanaka, Fukuyama, all of Japan

[73] Assignee: Sharp Kabushiki Kaisha, Osaka, Japan

[21] Appl. No.: 316,835

[22] Filed: Oct. 3, 1994

[51] Int. Cl.⁶ ..................................... H01L 29/78
[52] U.S. Cl. .......................... 257/390; 257/296; 365/146
[58] Field of Search ................... 257/390, 296, 257/298; 365/146

[56] References Cited

U.S. PATENT DOCUMENTS 4,755,864  7/1988  Ariizumi ................................. 257/390

FOREIGN PATENT DOCUMENTS

| 56-27958 | 3/1981 | Japan . | |
| 62-104162 | 5/1987 | Japan | 257/390 |
| 3-269894 | 12/1991 | Japan . | |
| 5-120889 | 5/1993 | Japan . | |
| 5-315573 | 11/1993 | Japan . | |
| 5-308133 | 11/1993 | Japan . | |

Primary Examiner—Jerome Jackson, Jr.
Attorney, Agent, or Firm—Nixon & Vanderhye, P.C.

[57] ABSTRACT

A semiconductor memory has a random access memory (DRAM) and a mask read only memory (MROM) formed on the same semiconductor substrate; each of the DRAM and MROM comprising a plurality of word lines, a plurality of bit lines and a plurality of memory cells: each of the memory cells included in the DRAM and the MROM comprising; a switching element including a source and drain regions and a gate electrode; a capacitance element formed of a lamination of an insulating film and a plate electrode subsequently laminated in this order; and a conductive parts connecting the switching element to the word lines, the bit lines, and a capacitance element; the MROM including a predetermined memory cell which lacks at least one part of the conductive parts.

2 Claims, 12 Drawing Sheets

DRAM AND MROM CELLS WITH SIMILAR STRUCTURE

BACKGROUND OF THE INVENTION

1. Field of the Invention

This invention relates to a semiconductor device, a method for manufacturing and a method for driving the same. More particularly, the invention relates to a memory integrally providing on the same chip a non-volatile memory (mask ROM) and a dynamic semiconductor memory (DRAM).

2. Description of the Prior Art

As a read only non-volatile memory, mask ROMs which are programmed with data during a manufacturing process are conventionally known. Mask ROMs of a contact hole programming type, as shown in FIG. 21, store data depending on whether or not a drain region D of a transistor T constituting each memory device is connected to bit line Y or Y1. In other words, data is written into the semiconductor device depending on whether a contact hole is opened which connects the bit line to the drain region of the transistor in the manufacturing process of semiconductor devices.

On the other hand, a dynamic semiconductor memory which can be programmed by users is also known.

in view of the user's convenience it is desirable to use both of the above two memories. However, a problem has arisen in that it is difficult to manufacture the read only non-volatile memory and the dynamic semiconductor memory on the same chip in the same manufacturing process because the two memories are different in structure.

For example, Japanese Unexamined Patent Publication No. SHO 56(1981)-27958 and Japanese Unexamined Patent Publication No. HEI 5(1993)-120889 disclose semiconductor devices in which a ROM and a RAM are formed on the same chip. Japanese Unexamined Patent Publication No. SHO 56(1981)-27958 describes a cell of a planar type as shown in FIG. 22 in which one end of the capacitor in the cell is connected to a transistor while the other end of the capacitor is connected to GND. In other words, FIG. 22 describes a semiconductor device that is programmed depending on whether both ends of the capacitor are not connected to each other as seen in cell Mbp or are short-circuited as seen in cell Map. However, for example, when a word line Xop is selected in the semiconductor device (and most of the memory cells connected to the word line Xop are given as cells in which both ends of the capacitor are short-circuited as seen in the cell Mbp), there arises a problem that a plate electrode constituting a capacitor in cell Mbp might be short-circuited with a bit line which works as a data line, which varies potential of the plate electrode and generates a noise. The variation in the potential of the plate electrode is transmitted to the plate electrode of cell Map, thereby affecting the bit line connected to cell Map which might induce an error in operation.

Moreover, Japanese Unexamined Patent Publication No. HEI 5(1993)-120889 discloses a semiconductor device having a stack cell. A capacitor of RAM in this semiconductor device is connected to an impurity region on one side of a transistor, and has a node electrode being connected to the definite potential. The capacitor of ROM in this semiconductor device is connected to the impurity region on one side of a transistor, and has a plate electrode which is either connected to a definite potential or provided to be opened. However, for example when a certain word line is selected in this semiconductor device (and most of the memory cells connected to the word line have a capacitor having a node electrode connected to the definite potential as described above), there arises a problem that the node electrode connected to the definite potential might be short-circuited with the bit line which works as the data line. In such a case, the definite potential of the node electrode varies and even the potential of the plate electrode is varied via a capacitance between the node and the plate electrodes. Furthermore, the variation in the potential at the plate electrode affects a cell having an opened plate electrode and appears in the data line to which the cell is connected, thereby causing an error in operation.

SUMMARY OF THE INVENTION

The object of the present invention is to provide a semiconductor device in which each memory such as an MROM and a DRAM is similar to each other in the structure and can be formed on the same chip in the same procedure, a method for manufacturing and a method for driving the same.

Therefore, the present invention provides a semiconductor memory having a random access memory (DRAM) and a mask read only memory (MROM) formed on the same semiconductor substrate; each of the DRAM and MROM comprising a plurality of word lines, a plurality of bit lines and a plurality of memory cells:

each of the memory cells included in the DRAM and the MROM comprising;

a switching element including source and drain regions and a gate electrode;

a capacitance element existing at least partially over the switching element and formed of an accumulation node electrode, an insulating film and a plate electrode subsequently laminated in this order, and conductive parts connecting the switching element to the word lines, the bit lines and the capacitance element, respectively; and the MROM further comprising a predetermined memory cell which lacks at least one part of the conductive parts.

The present invention also provides a semiconductor memory having a random access memory (DRAM) and a mask read only memory (MROM) formed on the same semiconductor substrate; each of the DRAM and MROM comprising a plurality of word lines, a plurality of bit lines and a plurality of memory cells:

each of the memory cells included in the DRAM and the MROM comprising;

a switching element including source and drain regions and a gate electrode, and a capacitance element existing at least partially over the switching element and formed of an accumulation node electrode, an insulating film and a plate electrode laminated in this order; and the MROM further comprising a predetermined memory cell which has the switching element, and the accumulation node electrode electrically connected to the switching element and at least partially formed on the switching element.

The present invention also provides a method for manufacturing a semiconductor device which comprises a DRAM and a MROM, the DRAM and the MROM including a memory cell which has a switching element and a capacitance element connected to the switching element, the MROM further including a predetermined memory cell which has the switching element and the capacitance element and lacks a conductive part connecting the switching element to the capacitance element so that the switching element is not connected to the capacitance element; the method comprising the steps of:

(i) forming the switching element by forming a gate electrode and source and drain regions on a semiconductor substrate;

(ii) forming an interlayer insulating film over the entire surface of the semiconductor substrate including the switching element;

(iii) opening a contact hole in the interlayer insulating film over the source and drain regions except for the source and drain regions of the switching element in the predetermined memory cell; and (iv) forming an accumulation node electrode, an insulating film and a plate electrode in this order on at least part of the switching element and on the source and drain regions.

The present invention also provides a method for manufacturing a semiconductor device which comprises a DRAM and a MROM, the DRAM and the MROM including a memory cell which has a switching element and a capacitance element connected to the switching element, the MROM further including a predetermined memory cell which has the switching element and a accumulation node electrode electrically connected to the switching element; the method comprising the steps of:

(i) forming the switching element by forming a gate electrode and source and drain regions on a semiconductor substrate;

(ii) forming an interlayer insulating film over the entire surface of the semiconductor substrate including the switching element;

(iiia) opening a contact hole in the interlayer insulating film over the source and drain regions of the switching element; and (iva) forming the accumulation node electrode at least on part of the switching element and on the contact hole, and forming an insulating film and a plate electrode on the accumulation node electrode in the memory cell except for the predetermined memory cell.

The present invention also provides a method for driving a semiconductor device using a semiconductor memory having a random access memory (DRAM) and a mask read only memory (MROM) formed on the same semiconductor substrate; each of the DRAM and MROM comprising a plurality of word lines, a plurality of bit lines and a plurality of memory cells: each of the memory cells included in the DRAM and the MROM comprising; a switching element including source and drain regions and a gate electrode; a capacitance element existing at least partially over the switching element and formed of an accumulation node electrode, an insulating film and a plate electrode subsequently laminated in this order, and conductive parts connecting the switching element to the word lines, the bit lines and the capacitance element, respectively; and the MROM further comprising a predetermined memory cell which lacks at least one part of the conductive parts; the method comprising:

allowing the DRAM to function by subjecting each of the DRAM to a writing and a reading process and a refreshing process; and allowing the MROM to function by subjecting all the MROM to a writing process of a signal "1" therein as an initial process followed by continuing a refreshing process with respect to the same memory cells, and subjecting the MROM to a reading process as seen in the DRAM when reading information; whereby a signal "1" is read from a memory cell in which the switching element and the capacitance element are connected, and a signal "0" is read from a memory cell lacks part of the conductive part.

The present invention also provides a method for driving a semiconductor device using a semiconductor memory having a random access memory (DRAM) and a mask read only memory (MROM) formed on the same semiconductor substrate; each of the DRAM and MROM comprising a plurality of word lines, a plurality of bit lines and a plurality of memory cells: each of the memory cells included in the DRAM and the MROM comprising; a switching element including source and drain regions and a gate electrode, and a capacitance element existing at least partially over the switching element and formed of an accumulation node electrode, an insulating film and a plate electrode laminated in this order; and the MROM further comprising a predetermined memory cell which has the switching element, and the accumulation node electrode electrically connected to the switching element and at least partially formed on the switching element; the method comprising:

allowing the DRAM to function by subjecting each of the DRAM to a writing and-a reading process, and a refreshing process; and allowing the MROM to function by subjecting all the MROM to a writing process of a signal "1" therein as an initial process followed by continuing a refreshing process with respect to the same memory cells, and subjecting the MROM to a reading process as seen in the DRAM when reading information; whereby a signal "1"0 is read from a memory cell in which the switching element and the capacitance elements are connected, and a signal "0" is read from a memory cell which has the switching element and the accumulation node electrode.

DESCRIPTION OF THE PREFERRED EMBODIMENTS

Figure 1:
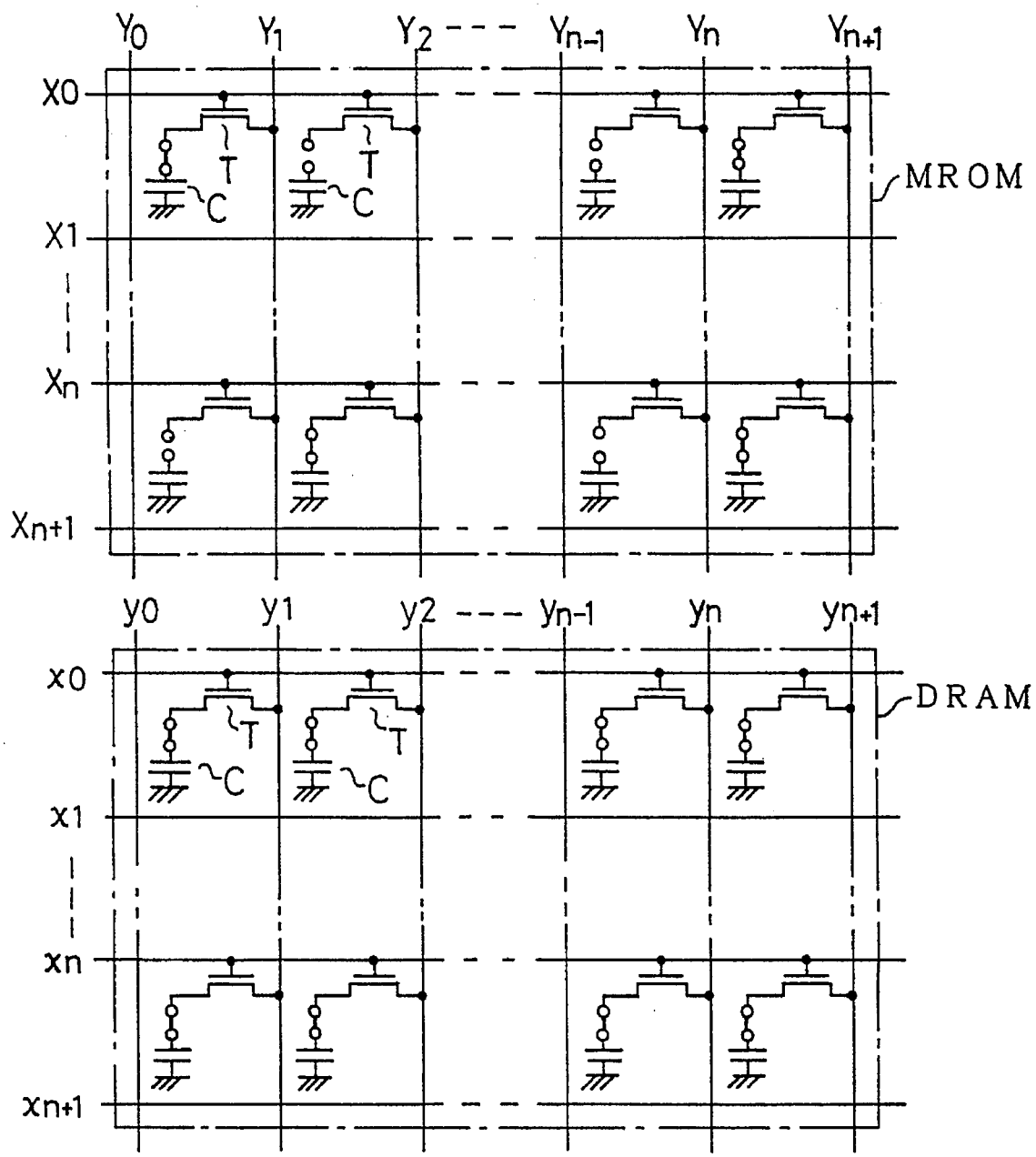
FIG. 1 is a circuit diagram showing a semiconductor device according to one embodiment of the present invention.

A semiconductor device according to the present invention is characterized in that a DRAM and an MROM are formed on the same semiconductor substrate. The semiconductor substrate of the present invention is not limited to any particular type as long as the substrate is normally used in the semiconductor device. Examples of such substrates include a silicon substrate and a compound semiconductor substrate formed of GaAs or the like. A silicon substrate is most preferable.

The DRAM of the present invention comprises a plurality of word lines, a plurality of bit lines and a plurality of memory cells constituted of one switching element, one capacitance element, and conductive parts each connecting the switching element to the capacitance element, the word line to the switching element, and the bit line to the switching element.

The switching element is constituted by a transistor. In the transistor, a gate electrode is formed on the semiconductor substrate with a gate insulating film sandwiched therebetween. The gate insulating film may be in the form of an $SiO_2$ or the like., and is preferably about 80 to 120 Å in thickness. The gate electrode may be formed of a single layered polysilicon, or a laminate structure of polysilicon, a high melting point metal like tungsten, a compound thereof or the like. When the gate electrode is formed of a single-layered polysilicon, the thickness of the gate electrode is preferably about 1500 to 3000 Å. The source and drain regions arranged by sandwiching the gate electrode may be preferably implanted with an N-type impurity like phosphorus, arsenic or the like, or a P-type impurity such as boron or the like at a concentration of about $1\times10^{14}$ to $1\times10^{15}$ $cm^{-2}$.

The capacitance element is formed by a lamination of an accumulation node electrode, an insulating film and a plate electrode. The accumulation node electrode can be made of any material as long as the material can be normally used in the electrode. Such materials as a single layered polysilicon, a silicide of polysilicon and tungsten, titanium or the like can be used for the accumulation node electrode. Preferably, the thickness of the accumulation node electrode is about 1500 to 3000 Å. The insulating film can be made of an $SiO_2$ film, $SiO_2/SiN$ film, ferroelectric film formed of PZT or PLZT or the like. Preferably, the thickness of the insulating film is about 50 to 120 Å. As the plate electrode, one similar to the above-mentioned accumulation node electrode can be used.

In addition, the conductive parts each connecting the switching element to the capacitance element, the word line to the switching element, and the bit line to the switching element may be formed separately from each element such as the switching element, the capacitance element, the word line and the bit line, or may be formed as a part of such element.

The DRAM of the present invention is constituted so that either the source or drain region of the switching element described above is connected to an accumulation node electrode of the capacitance element. The gate electrode which is formed of the switching element is expanded and serves as a word line. The word line connects a plurality of adjacent switching elements. The switching element is connected to the source or drain region which is not connected to the accumulation node electrode of the capacitance element is connected to the bit line.

The MROM of the present invention voluntarily comprises a plurality of word lines, a plurality of bit lines and a plurality of memory cells constituted of one switching element, one capacitance element and conductive part similar to one described above. The MROM also includes (a) a memory cell having the switching element, the capacitance element and lacking part of conductive parts which connect the switching element to the capacitance element, a word line to the switching element, and a bit line to the switching element, respectively, or (b) a memory cell having a switching element similar to one described above, and a capacitance element having only an accumulation node electrode electrically connected to the switching element. Examples of memory cells lacking part of the conductive parts include a memory cell in which conductive parts are lacking between the switching element and the capacitance element, or a memory cell in which an insulating layer is formed between the switching element and the capacitance element (so that the switching element is not connected to the capacitance element), or a memory cell in which conductive parts are lacking between the switching element and the bit line or the word line. In addition, examples of memory cells which have the switching element and only the accumulation node electrode electrically connected to the switching element include a memory cell which does not have the same structure as the capacitance element in the DRAM and lacks both the insulating film and the plate electrode.

It is possible to enter a data "1" in the memory cells of MROM having the same structure as that of DRAM and enter a data "0" in the memory cell of (a) or (b) described above.

A first method for manufacturing the semiconductor device of the present invention involves forming a switching element by forming a gate electrode and source and drain regions on a semiconductor substrate at step (i). The gate electrode can be formed by a known method, for example, chemical vapor deposition (CVD) after a gate insulating film is formed on the semiconductor substrate. The gate electrode is used as a mask to form a source or drain region by ion implantation.

At step (ii), an interlayer insulating film is formed over the semiconductor substrate including the switching element. The interlayer insulating film such as, for example, an $SiO_2$ film, an SIN film, an $SiO_2$/SIN film, an NSG film, a PSG film or a BPSG film can be formed by a known method, for example, CVD or the like. Preferably, the film can be formed to a thickness of about 1500 to 6000 Å.

At step (iii), a contact hole is opened in the interlayer insulating film over the source or drain region excepting the source or drain region of the switching element of predetermined memory cells. In this case, the contact hole is opened in the interlayer insulating film either on the source or drain region of the switching element in the memory cell of the DRAM and in part of the memory cell of the MROM whereas the contact hole is not opened in the interlayer insulating film on the source and the drain regions of the switching element in the predetermined memory cell in the MROM. The contact hole can be opened by a known method, for example, photolithography or etching, and set to a predetermined position with the ROM mask and fuse.

Subsequently, at step (iv), an accumulation node electrode, an insulating film and a plate electrode are formed in this order on at least part of the switching element as well as the source or drain region. In this case, when the contact hole is opened in the interlayer insulating film over the source or drain region of the switching element in former step, the switching element is connected to the capacitance element through the contact hole. On the other hand, when the contact hole is not opened in step (iii), the switching element is not connected to the capacitance element. In other words, the electric connection of the switching element to the capacitance element depends on whether a contact hole is opened in the interlayer insulating film intervening, for example, between the switching element and the capacitance element in the manufacturing process. Incidentally, the accumulation node electrode, the insulating film and the plate electrode in this order can be formed by a known method.

At subsequent steps, an interlayer insulating film similar to one described above is formed on the semiconductor substrate including the above switching element and the capacitance element, a contact hole is opened in the interlayer insulating film over the either of source or drain region where the accumulation node electrode is not formed and a bit line is formed on the interlayer insulating film including the contact hole. The switching element and the bit line can be connected to each other by forming the bit line in this manner in the memory cell of DRAM or MROM.

The memory cell which lacks conductive parts between the switching element and the bit line can be obtained by the following steps. At step (iii), the contact hole is formed on the source or drain region of all the switching elements. At step (iv), the accumulation node electrode, the insulating film and the plate electrode are formed in this order. After step (iv), the interlayer insulating film as shown above is formed on the semiconductor substrate which includes the switching element and the capacitance element, and then the bit line is formed without opening a contact hole on the source or drain region in predetermined memory cells. This enables obtaining the memory cell lacks part of the conductive part between the switching element and the bit line, whereby the switching element is not connected to the bit line.

Furthermore, the second method for manufacturing the semiconductor device involves performing steps (i) and (ii) of the above described followed by opening a contact hole in the interlayer insulating film either on the source or drain region of the switching element at step (iiia). In such a case, the contact hole is opened in the same manner on the DRAM and MROM without any differentiation between the two.

Then, at step (iva), an accumulation node electrode is formed at the outset on at least part of the switching element and on the contact hole. Subsequently, an insulating film and a plate electrode are formed on the accumulation node electrode of the DRAM and part of the memory cells in the MROM. On the other hand, no insulating film and no plate electrode are formed on the accumulation node electrode on the switching element that has been predetermined in the MROM.

In this manner, the method for manufacturing a semiconductor of the present invention enables manufacturing the semiconductor device on the same substrate and through the same steps without adding any special steps, the semiconductor device comprising the DRAM including the memory cell in which the switching element and the capacitance element are connected to each other, and either (a) the MROM partially including the memory cell which includes both the switching element and the capacitance element but which cannot be driven because of the lack of at least one part of the conductive parts, or (b) the MROM partially including a memory cell which includes the switching element and only the accumulation node electrode connected to the switching element.

Furthermore, the method for driving the semiconductor device according to the present invention allows the DRAM to function as a writing and reading memory by subjecting each of the memory cells to writing and reading process and refreshing process. In addition, the same method allows the MROM to function as a read only memory by subjecting all the memory cells to a process of writing a signal "1" as an initial processing and by continuing a refreshing operation when information is read from the memory, a signal "1" can be read from a memory cell in which the switching element and the capacitance element are connected to each other by performing reading operation as shown in the DRAM, simultaneously, a signal "0" can be read from a memory cell in which the switching element is not connected to the capacitance element, or a memory cell comprising a switching element and only an accumulation node electrode connected to the switching element.

A semiconductor device, a method for manufacturing and method for driving the same will be described herein in conjunction with the accompanying drawings.

EMBODIMENT 1

Figure 2:
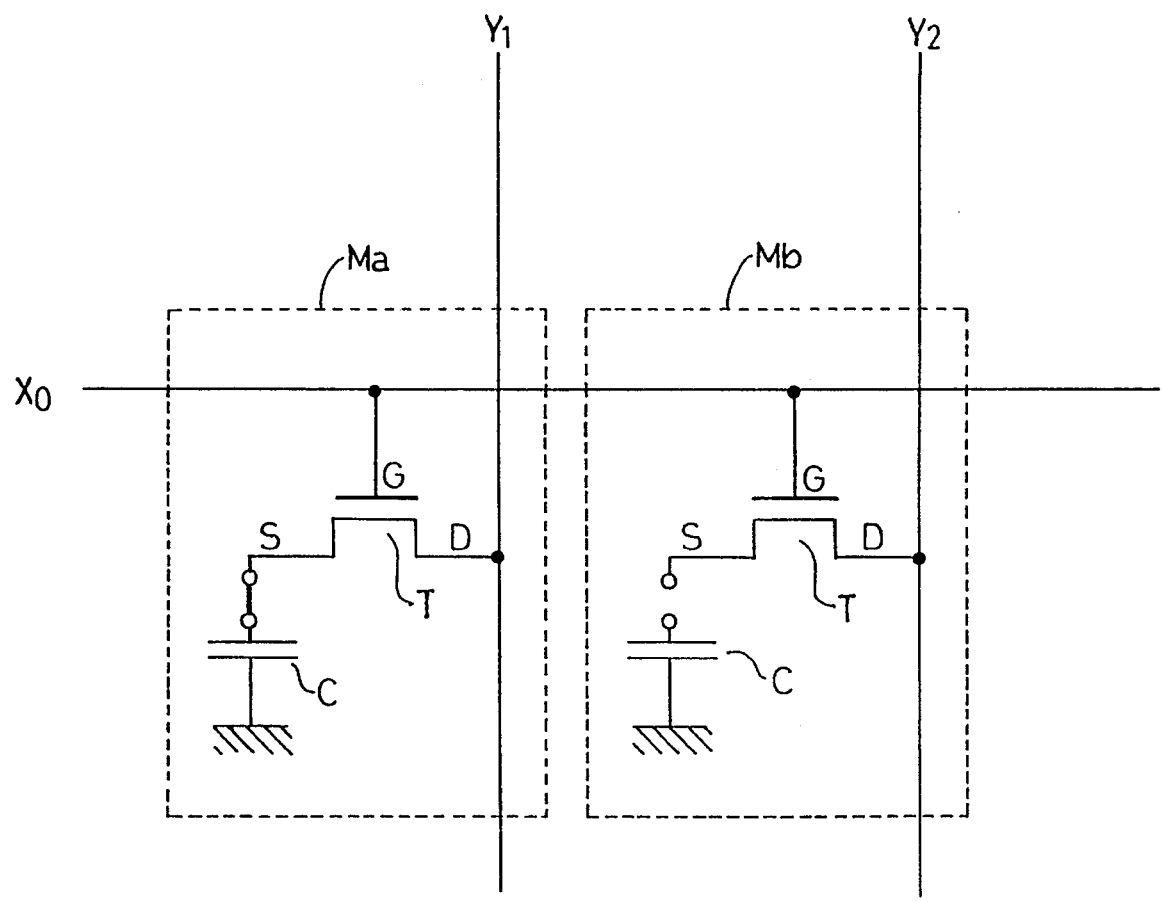
FIG. 2 is an expanded view of the essential portion of FIG. 1.
Figure 3:
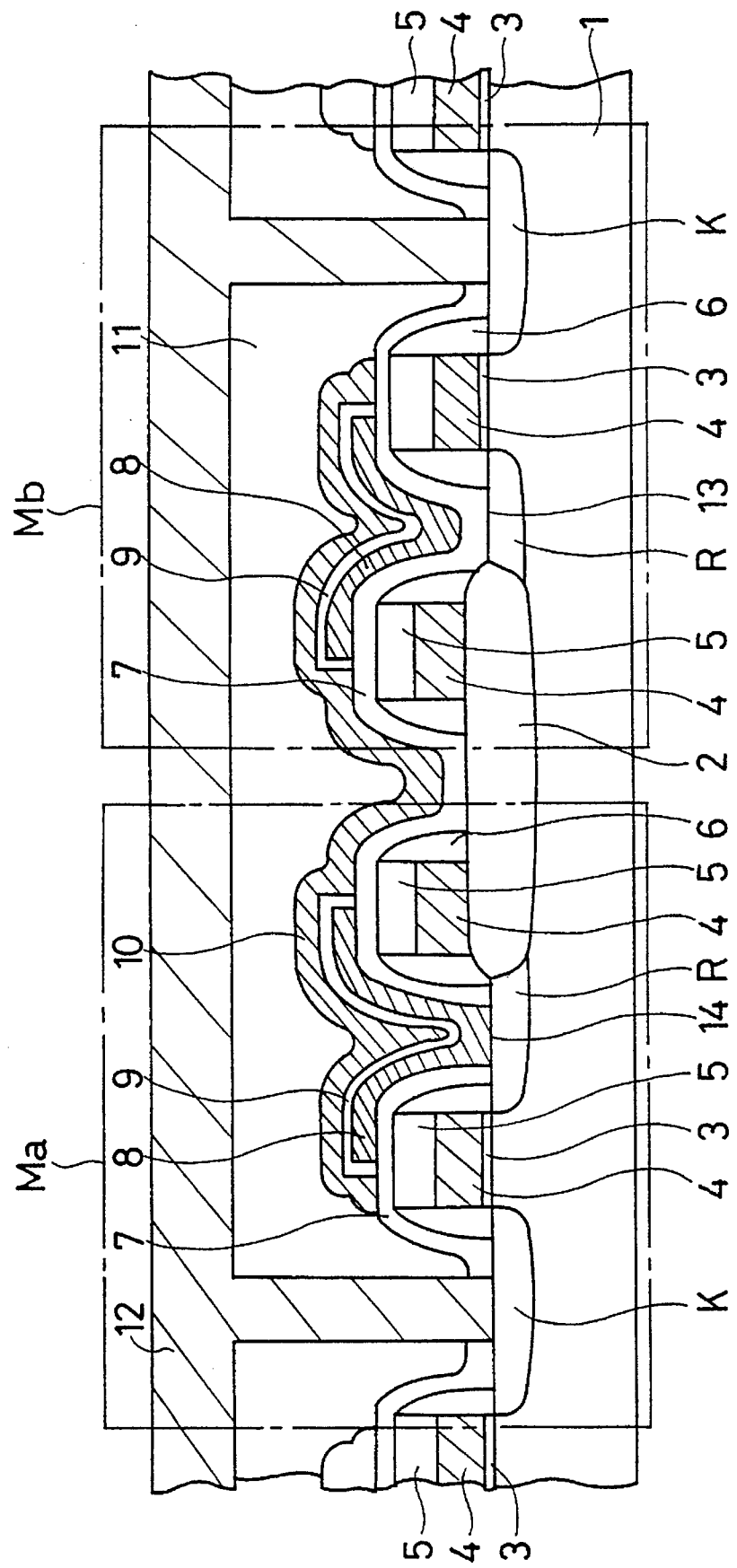
FIG. 3 is a schematic sectional view of an essential portion of the semiconductor memory of FIG. 2.

FIG. 1 is a circuit diagram showing one embodiment of the semiconductor device according to the present invention. FIG. 2 is an expanded circuit diagram showing a portion of the MROM shown in FIG. 1. FIG. 3 is a schematic sectional view of the portion of FIG. 2.

Referring to FIGS. 1 and 2, symbols $X_0, X_1, ---X_n, X_{n+1}$ designate word lines, symbols $Y_0, Y_1, ---, Y_n, Y_{n+1}$ designate bit lines. Each of the memory cells located by these word lines and bit lines is provided with a transistor T constituting a switching element and a capacitor C constituting a capacitance element.

In all the memory cells in the DRAM portion, the drain region of the transistor T is connected to the bit line, the gate electrode of the transistor T is connected to the word line, and the source region of the transistor is connected to one electrode of the capacitor C. Thus data can be written in and read from the DRAM portion.

In the memory cells that have been predetermined in the MROM portion, the drain region of the transistor T is connected to the bit line, the gate electrode of the transistor T is connected to the word line, and the source region of the transistor is not connected to one electrode of the capacitor C. Thus data can neither be written in nor read from such predetermined MROM portions. In other memory cells in the MROM, the drain region of the transistor T is connected to the bit line, the gate electrode of the transistor T is connected to the word line, and the source region of the transistor T is connected to one electrode of the capacitor C. Thus data can be written in and read from such memory cells in the MROM.

The DRAM and the MROM are formed on the same semiconductor substrate, and the DRAM provides a complete conductive circuit which electrically connects the word line, the bit line, the transistor T and the capacitor C so that the transistor T either charges or discharges the capacitor C in response to a voltage applied from the word line and the bit line. On the other hand, the MROM includes not only the cell Ma but also the cell Mb (see FIG. 2) in which the conductive circuit is lacking (electrically insulated) so that the capacitor C can neither be charged nor discharged.

Consequently, when the memory controller incorporates a memory shown in FIG. 1, the DRAM can be voluntarily written and read data while continuing a refreshing operation. On the other hand, to all the memory cells in the MROM is written a signal "1" in a similar operation to the DRAM after the power is applied. For example, when an electric potential showing a level "1", for example Vcc, is applied to the bit line while turning of the transistor by applying a predetermined electric potential to the gate electrode, the capacitor in the cell Ma accumulates electric charge through the transistor, whereas the capacitor in the cell Mb does not accumulate electric charge because it is not connected to the transistor. Then, a refreshing operation similar to the DRAM is followed. When data is read, an electric potential different from Vcc, for example GRD potential, is applied to the bit line to turn on the transistor of the memory cell to be selected. If the cell Ma is selected, the potential of the bit line is changed by the accumulated charges of the capacitor. On the other hand, if the cell Mb is selected, the potential of the bit line is not changed. Accordingly, the data "1" or "0" can be detected with the result that the MROM functions as a read only memory.

The method for manufacturing the semiconductor device having cells Ma and Mb shown in FIG. 3 will be explained in conjunction with FIGS. 4 through 10

Figure 4:
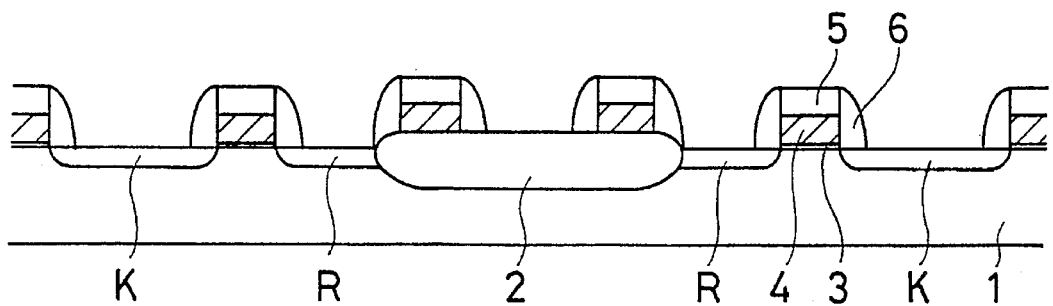
FIGS. 4 through 10 are step views showing a method for manufacturing the semiconductor memory of FIG. 3.

At the outset, as shown in FIG. 4, thermal oxide film 2 is formed of about 0.4 µm thick $SiO_2$ on the silicon substrate 1 for device isolation. Then, about 100 Å thick gate oxide film 3 is formed on the silicon substrate 1, a polysilicon film having a high concentration of phosphorus diffused therein is deposited to a thickness of about 3000 Å followed by etching the polysilicon film into a predetermined configuration to form a gate electrode 4 (a word line). Subsequently, an $SiO_2$ film is deposited on the gate electrode 4, by CVD method followed by forming a spacer 5 and a side wall spacer 6 made of $SiO_2$ by anisotropic etching such as RIE. Then, diffusion regions K and R are formed using the gate electrode 4 and the sidewall spacer 6 as a mask to obtain a transistor.

Figure 5:
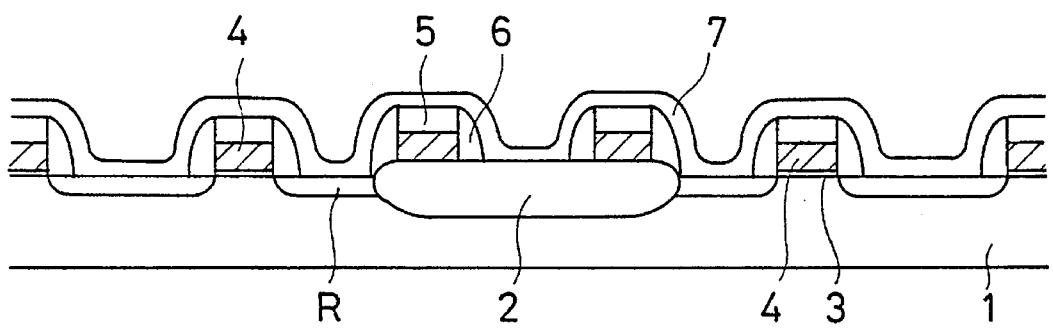

Then, as shown in FIG. 5, an $SiO_2$ film 7 is formed as an interlayer insulating film over the silicon substrate 1 including a transistor.

Figure 6:
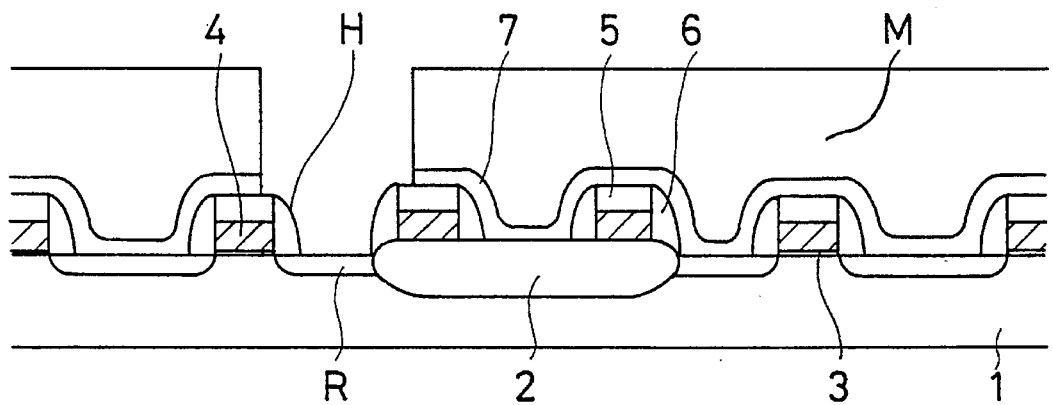

Subsequently, as shown in FIG. 6, a resist layer is laminated on the $SiO_2$ film 7 to form a resist film M, and then the $SiO_2$ film 7 on the diffusion region R corresponding to a cell other than a predetermined memory cell, i.e., Ma is removed using the resist film M as a mask until at least part of the surface in the diffusion region R is exposed thereby forming a contact hole H. Incidentally, the $SiO_2$ film 7 is not removed from the diffusion region R corresponding to the cell Mb that has been predetermined, whereby no contact hole is opened.

Figure 7:
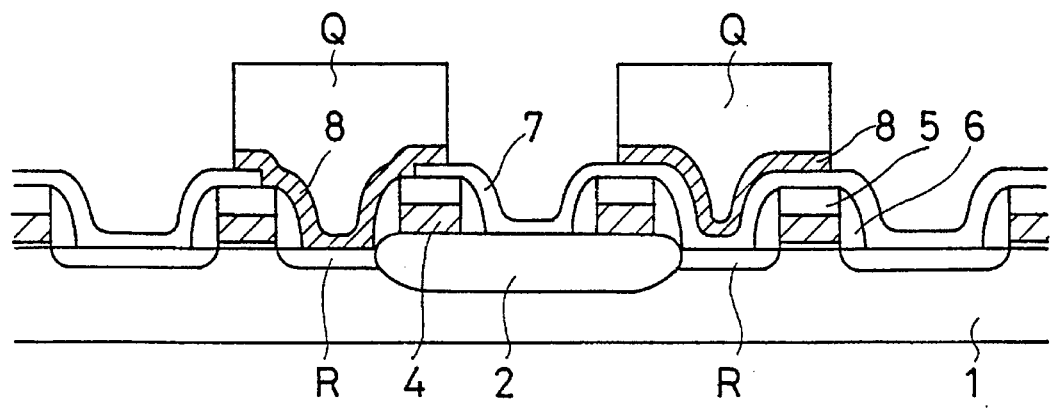

As shown in FIG. 7, the resist film M is removed and polysilicon doped with a high concentration of phosphorus is formed to a thickness of about 500 Å on the silicon substrate 1 including the transistor and the contact hole H by CVD method. Then, the resist layer is deposited on the polysilicon to form a resist film Q having a desired pattern followed by patterning polysilicon by projection exposure and RIE anisotropic etching using the resist film Q as a mask to form an accumulation node electrode 8 of the capacitor. In this process, the accumulation node electrode 8 corresponding to the cell Ma is electrically connected to the diffusion region R of the transistor through the contact hole (see 14 in FIG. 3). However, the accumulation node electrode 8 corresponding to the cell Mb is electrically insulated with the diffusion region R (see 13 in FIG. 3).

Figure 8:
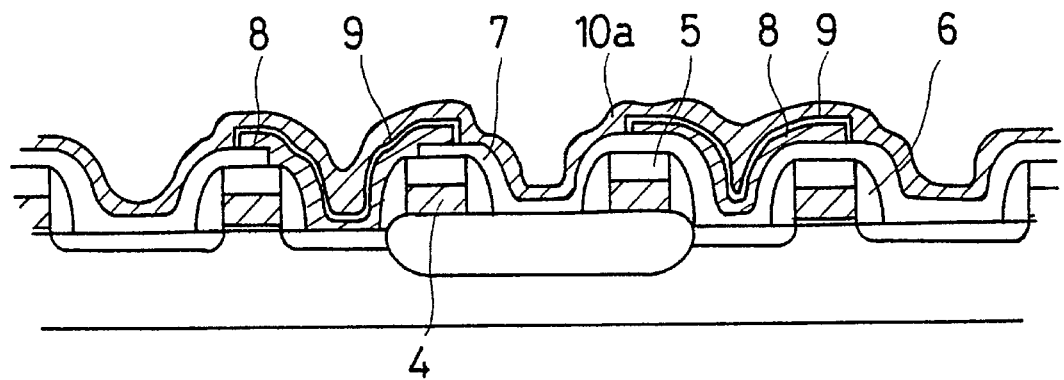

Subsequently, as shown in FIG. 8, an SiN insulating film 9 having a thickness of about 80 Å is formed on the accumulation node electrode 8. In addition, a polysilicon film 10a doped with a high concentration of phosphorus is deposited to a thickness of about 1500 Å.

Figure 9:
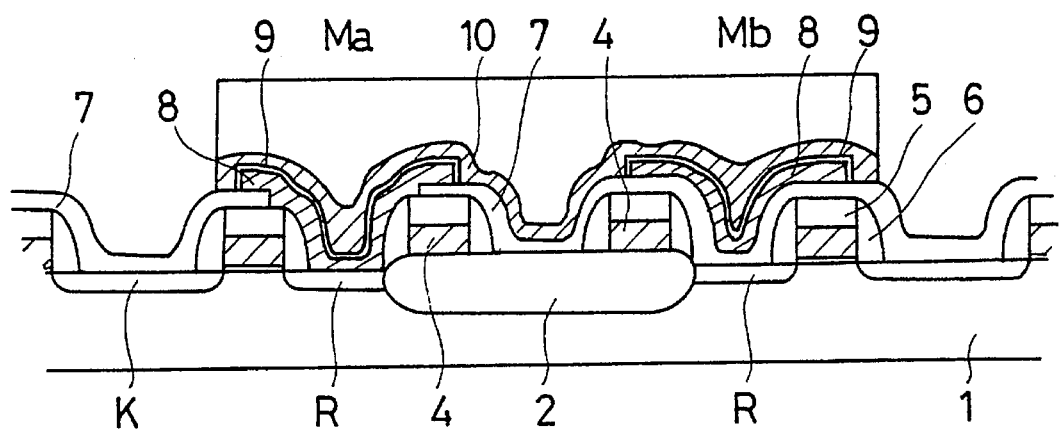

As shown in FIG. 9, the polysilicon film 10a is etched to a desired configuration by projection exposure and RIE anisotropic etching, thereby forming a plate electrode 10.

Figure 10:
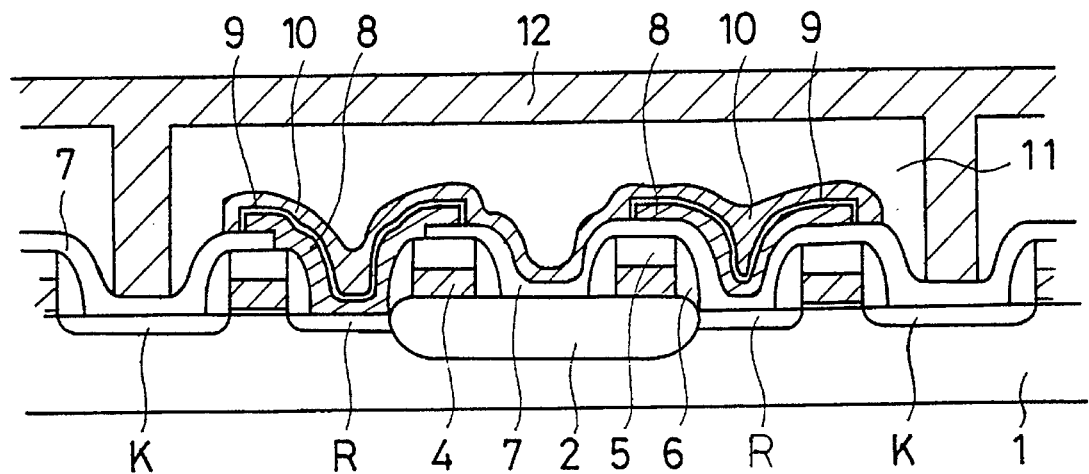

Then, as shown in FIG. 10, a $SiO_2$ film 11 is deposited over the silicon substrate 1 for planarization, and then $SiO_2$ films 7, 11 on the diffusion region K of cells Ma and Mb are removed to form a bit contact hole. A metal film formed of Al, tungsten, Cu or the like over the $SiO_2$ film 11 including the bit contact hole is laminated followed by patterning the metal film to form a bit line 12. Incidentally, a known method for manufacturing of the DRAM can be used in the above steps.

In the above manufacturing steps, the accumulation node electrode 8 and the diffusion region R are insulated in the cell Mb. However, the bit line 12 in the cell Mb may be insulated with the diffusion region K. In this manner, the DRAM and the MROM shown in FIG. 1 can be formed on the same semiconductor substrate in the same manufacturing step.

EMBODIMENT 2

Figure 11:
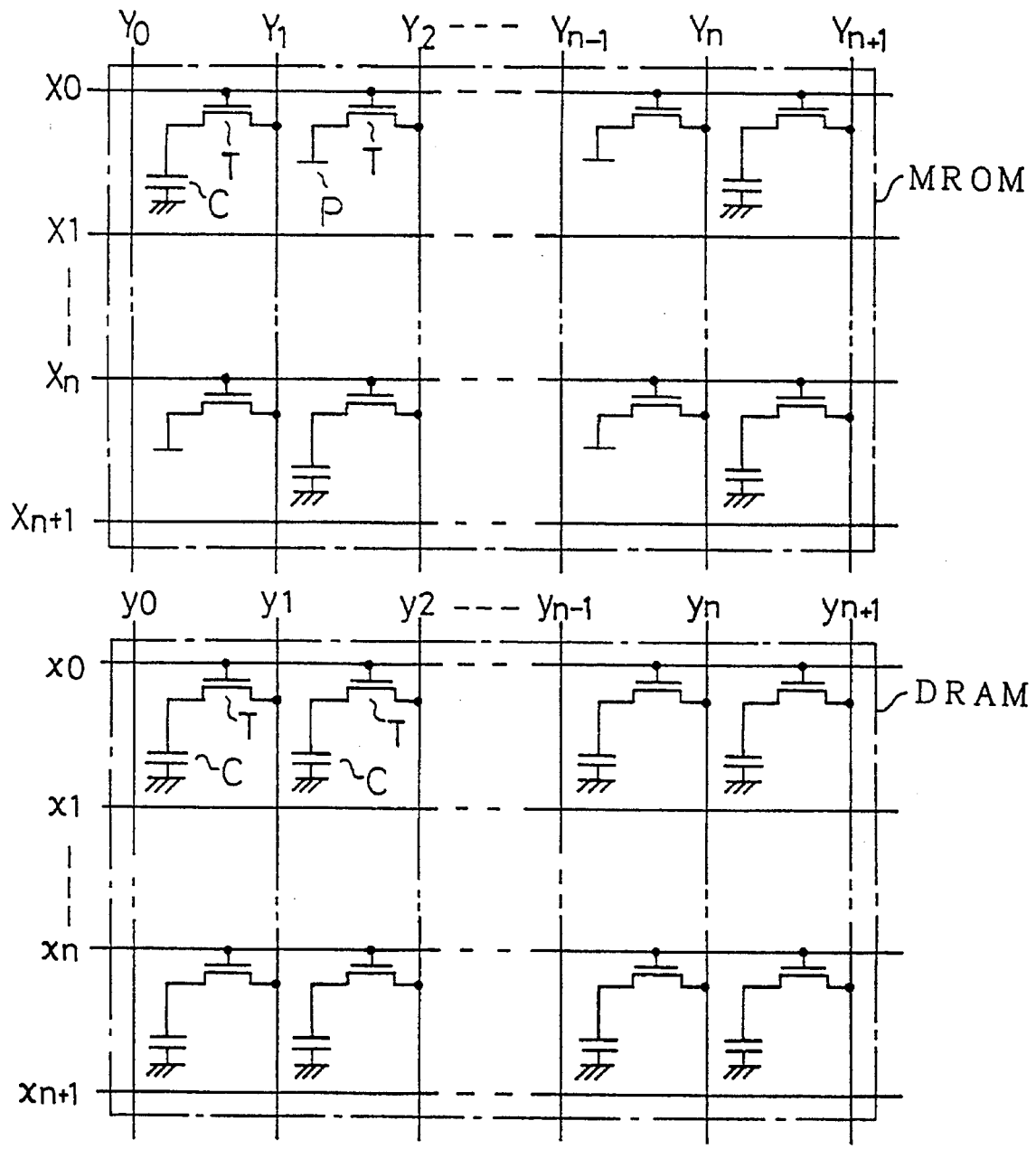
FIG. 11 is a view circuit diagram showing the semiconductor memory according to another embodiment of the present invention.
Figure 12:
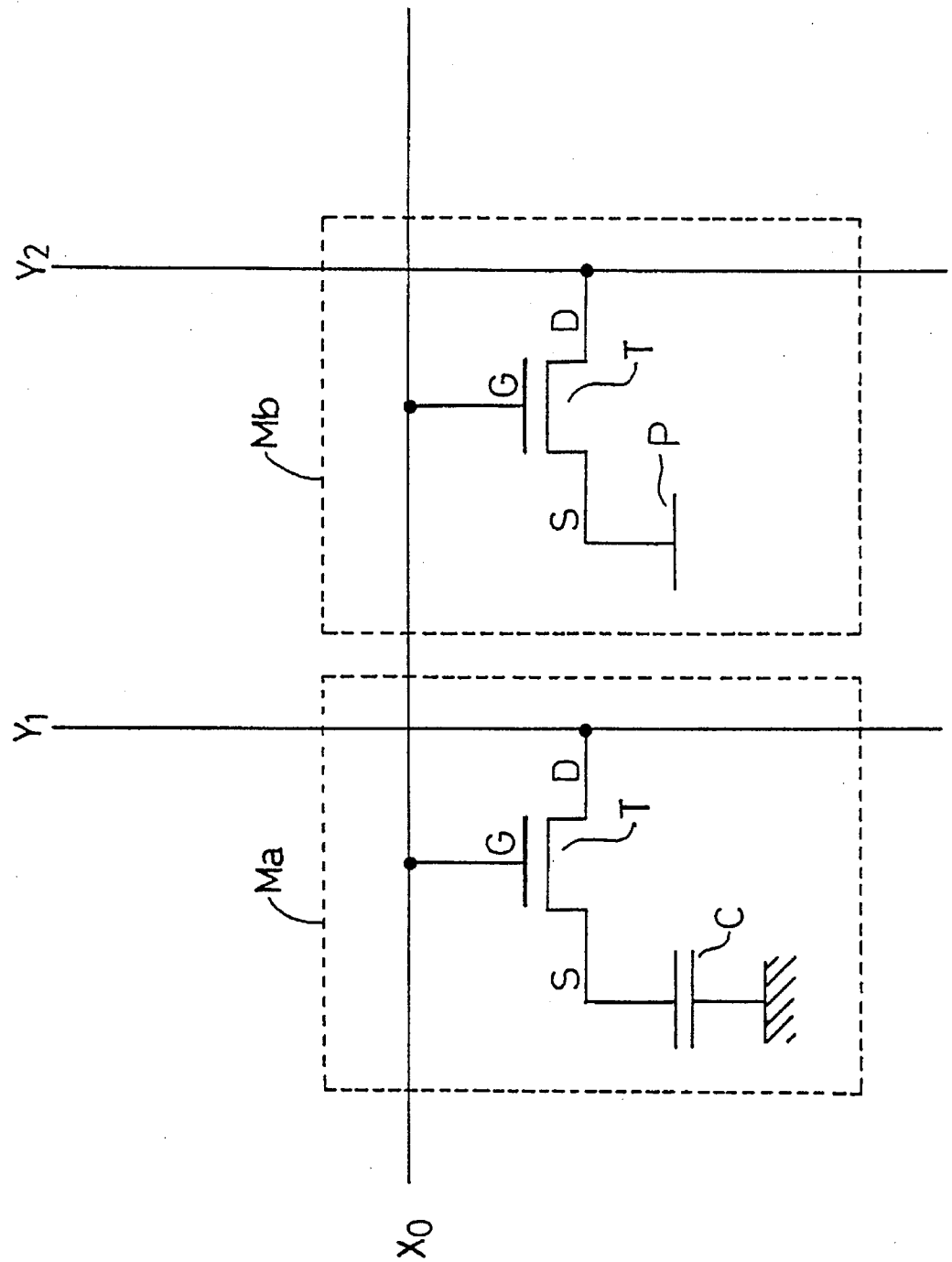
FIG. 12 is an expanded view of a portion of FIG. 11.
Figure 13:
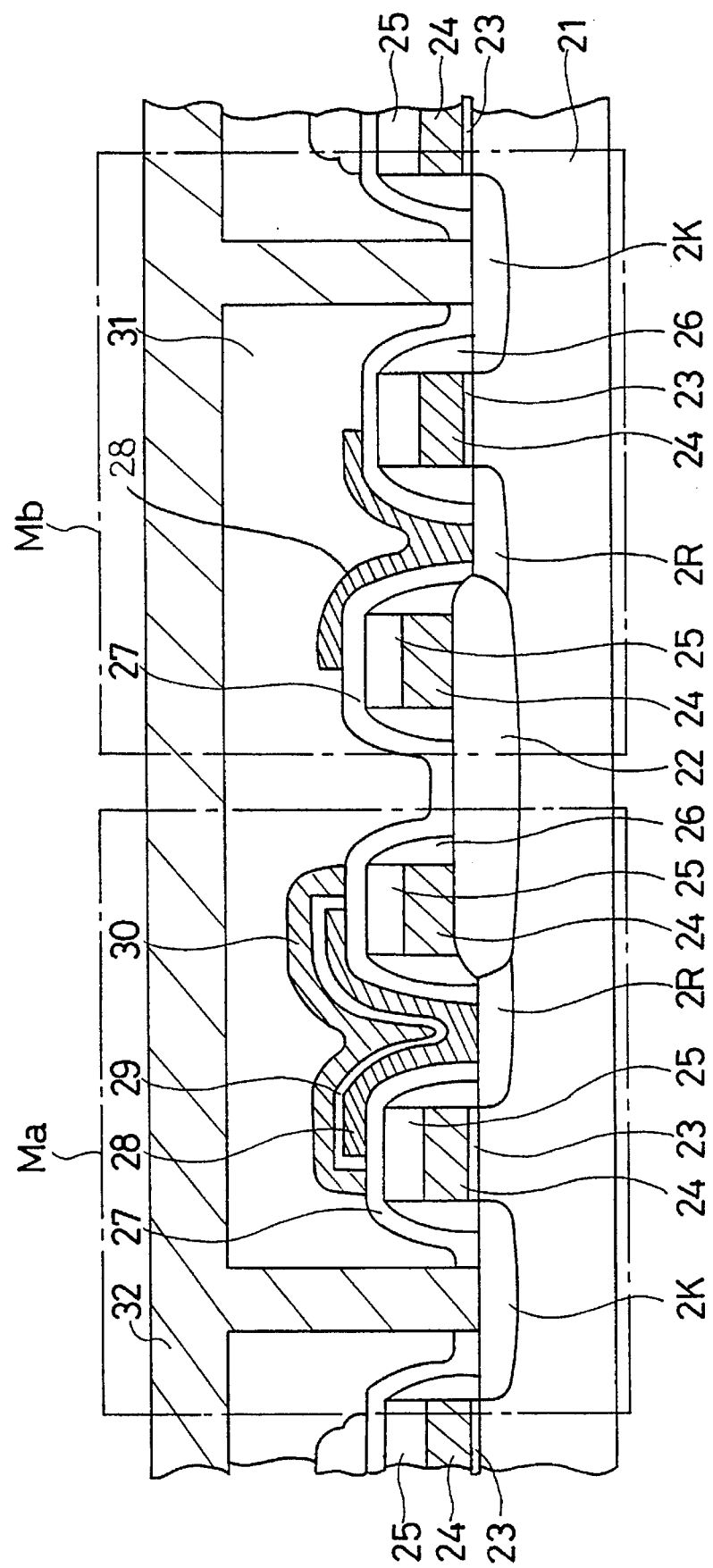
FIG. 13 is a schematic sectional view showing a semiconductor memory of FIG. 12.

FIG. 11 is a circuit diagram showing another embodiment of the semiconductor device according to the present invention. FIG. 12 is an expanded circuit diagram showing a detailed portion of MROM of FIG. 11. FIG. 13 is a schematic sectional view of the essential portion of FIG. 12.

Referring to FIGS. 11 and 12, symbols $X_0$, $X_1$ - - - $X_n$, $X_{n+1}$ designate word lines, symbols $Y_0$, $Y_1$, $Y_2$ - - - $Y_{n-1}$, $Y_n$, $Y_{n+1}$ designate bit lines. Each of the memory cells located by these word lines and bit lines is provided with a transistor T constituting a switching element and a capacitor C constituting a capacitance element, or a transistor T and an accumulation node electrode.

The DRAM portion is constituted as a writable and readable memory in the same manner as embodiment 1.

In the memory cells that have been predetermined in the MROM portion only an accumulation node electrode P is formed in place of the capacitance element in the DRAM. The accumulation node electrode P is connected to the source region of the transistor T. Consequently, data can neither be written in nor read from the MROM portion.

Accordingly, both the DRAM and MROM are formed on the same semiconductor substrate. The DRAM which is shown as a cell Ma in FIG. 12 provides a complete conductive circuit electrically connecting word lines, bit lines, the transistor T and the capacitor C so that the transistor T either charges or discharges the capacitor C in response to a voltage applied from the word lines and bit lines. On the other hand, the MROM includes not only the cell Ma but also the cell Mb which has a switching element and an accumulation node electrode connected to the switching element so that the capacitor C can neither be charged nor discharged.

Therefore, when a known memory controller incorporates a memory shown in FIG. 11, the DRAM can be voluntarily written and read data while continuing the refreshing operation. On the other hand, all the memory cells in the MROM is written a signal "1" in a similar operation to the DRAM after the power is applied, followed by continuing the refreshing operation in the same manner as the DRAM. When data are read, the MROM functions as a read only memory by outputting data in the same manner as the DRAM so that a signal "1" is read from an address having the Ma cell whereas a signal "0" is read from an address having the Mb cell.

Then, the method for manufacturing the semiconductor device having cells Ma and Mb shown in FIG. 13 will be explained in conjunction with FIGS. 14 through 20.

Figure 14:
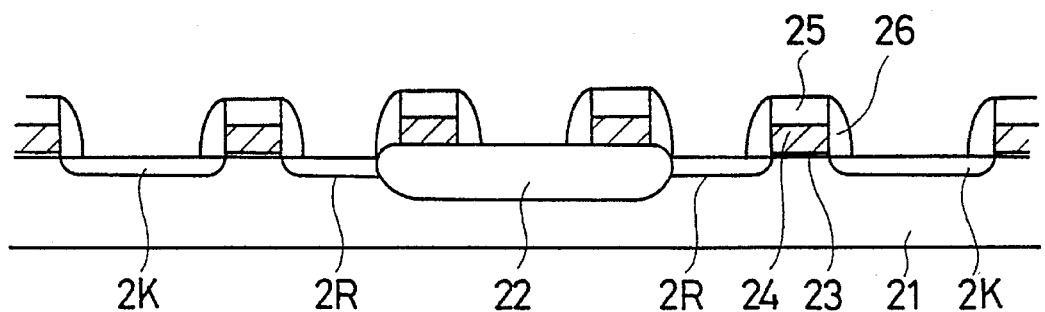
FIGS. 14 to 20 are step views showing a method for manufacturing a semiconductor device of FIG. 13.

At the outset, as shown in FIG. 14, a device isolation 22 is formed on the silicon substrate 21 in the same manner as embodiment 1, a transistor is obtained which has a gate oxide film 23, a gate electrode 24, a spacer 25, a side wall spacer 26 and diffusion regions 2K and 2R.

Figure 15:
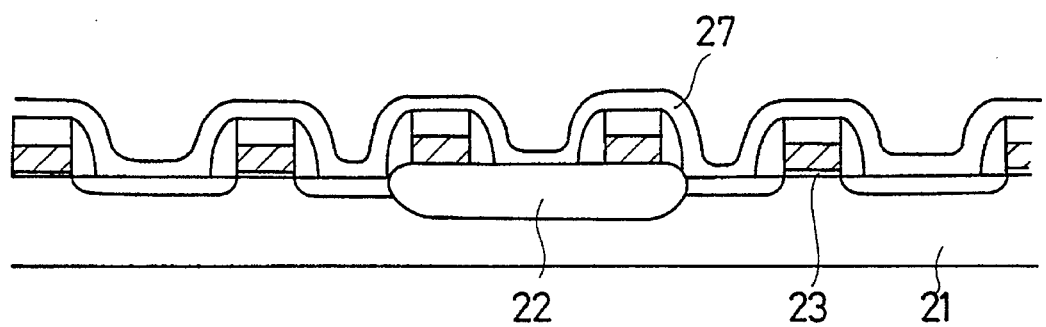

Subsequently, as shown in FIG. 15, an $SiO_2$ film 27 is formed as an interlayer insulating film over the silicon substrate 21 including a transistor.

Figure 16:
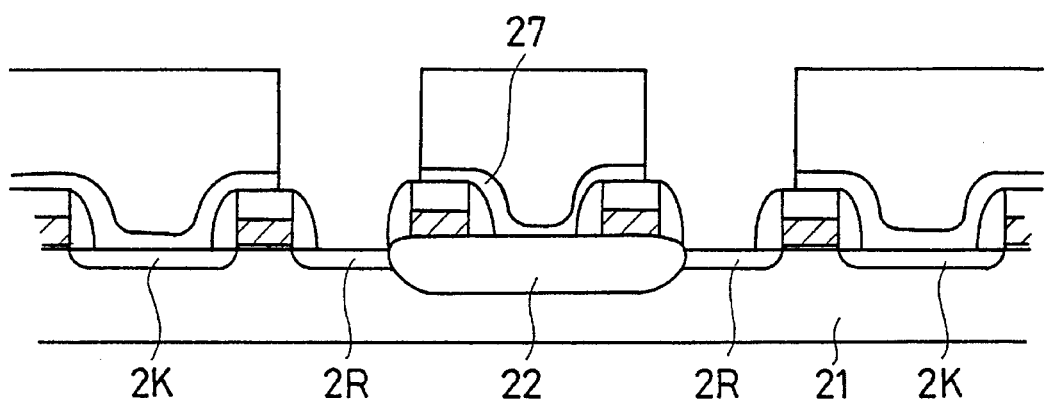

Then, as shown in FIG. 16, a contact hole is opened in the diffusion region 2R of the transistor in all the memory cells in the same manner as embodiment 1.

Figure 17:
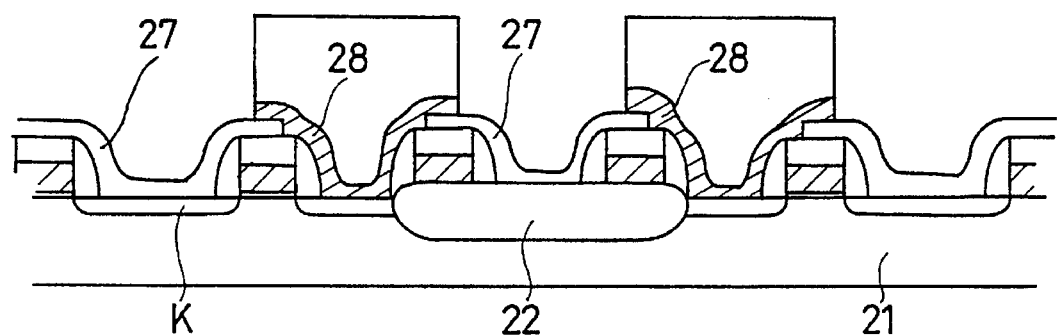

After that, as shown in FIG. 17, an accumulation node electrode 28 is formed on the silicon substrate 21 including a transistor and a contact hole in the same manner as embodiment 1. In the process, the accumulation node electrode 28 is electrically connected to the diffusion region 2R through the contact hole.

Figure 18:
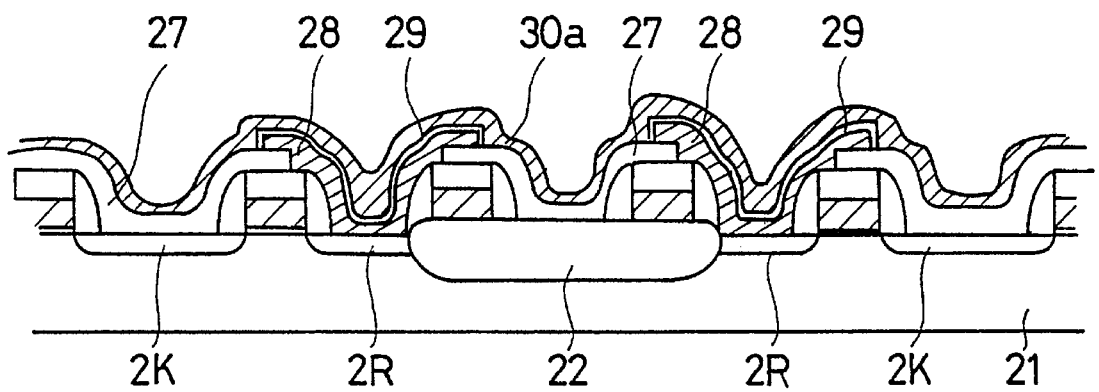

Then, as shown in FIG. 18, an insulating film 29 and a plate electrode material 30a are laminated in the same manner as embodiment 1.

Figure 19:
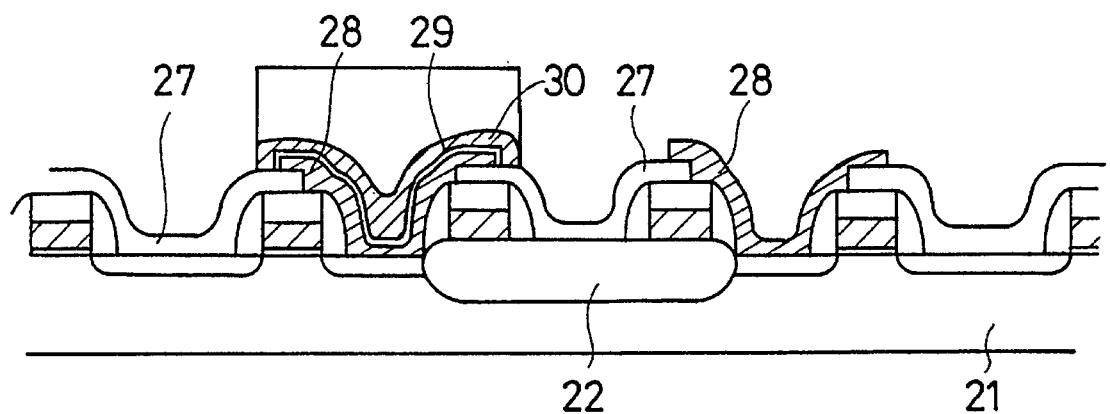

As shown in FIG. 19, the plate electrode material 30a is patterned and formed into a plate electrode 30 only in the cell Ma.

Figure 20:
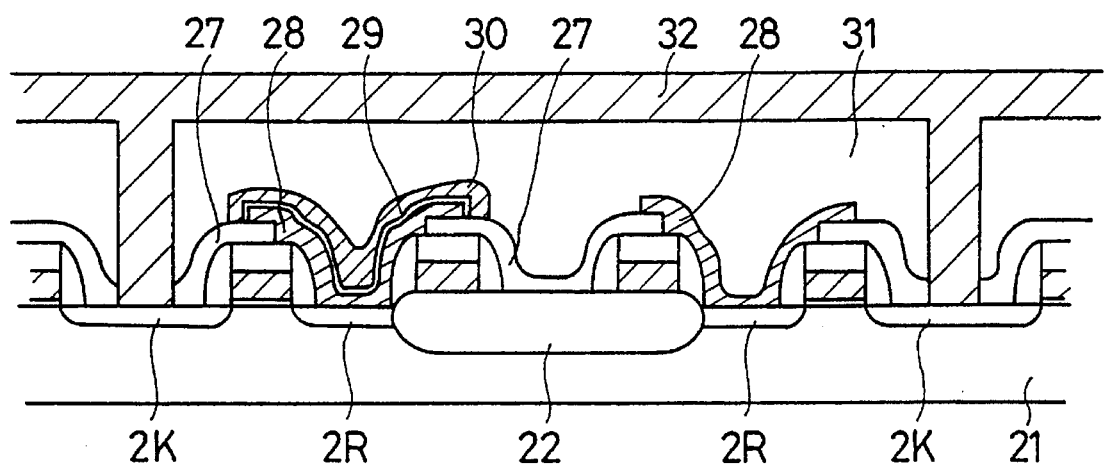
Figure 21:
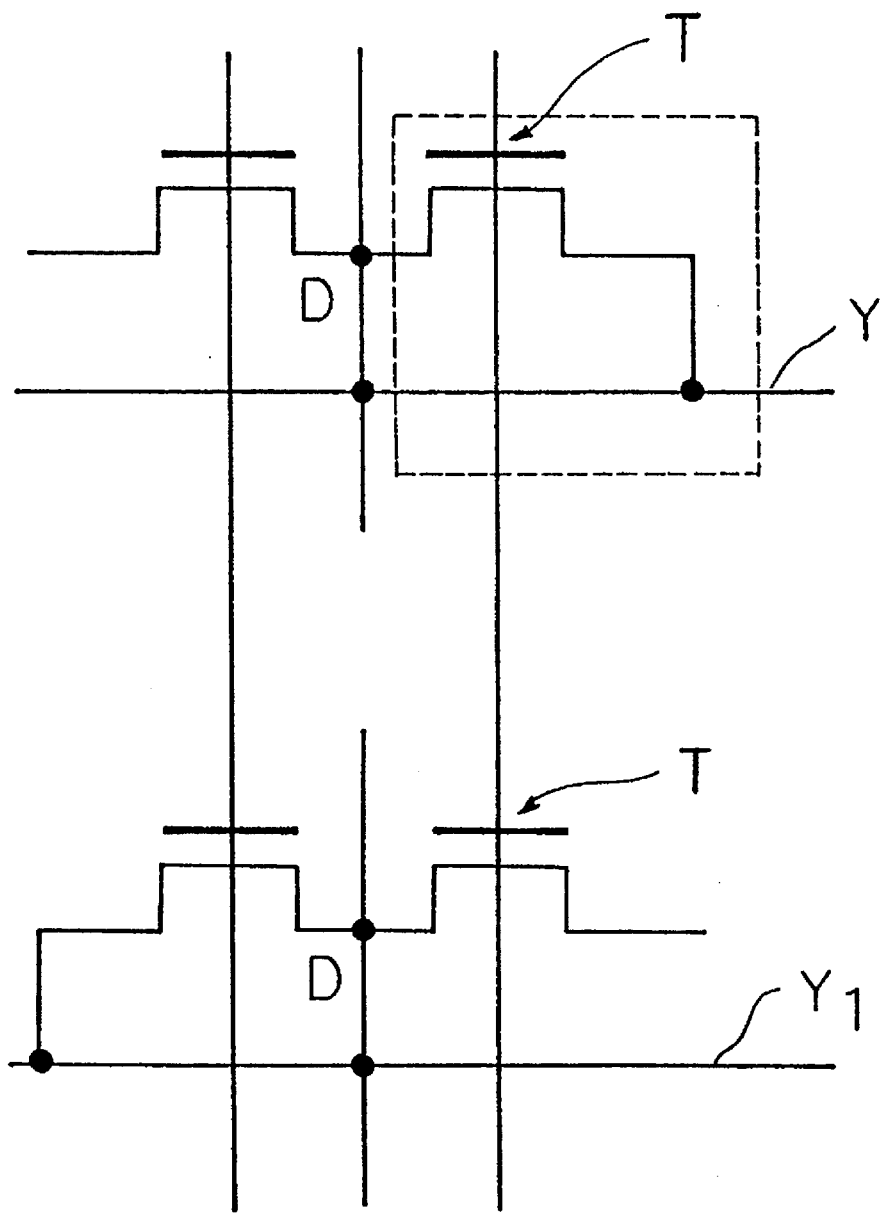
FIG. 21 is a circuit diagram showing a conventional read only memory.
Figure 22:
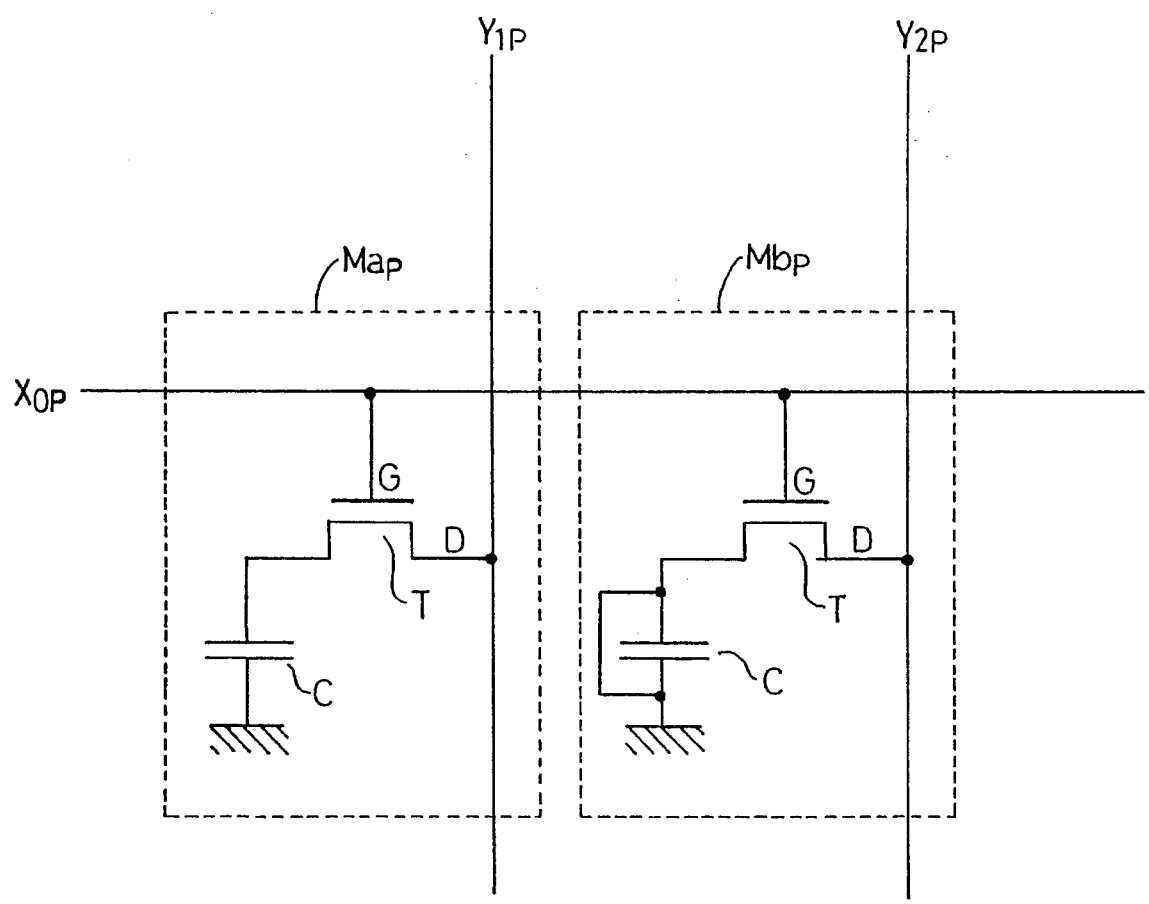
FIG. 22 is a circuit diagram showing a conventional semiconductor device.

Then, as shown in FIG. 20, an $SiO_2$ film 31 is laminated on the silicon substrate 21 including these elements, and a bit contact hole is opened and a bit line 32 is formed.

In this manner, the DRAM and the MROM shown in FIG. 11 are formed on the same substrate in the same manufacturing process.

Consequently, in accordance with the present invention, on the same chip a read only memory for programming data when the memory is manufactured and a dynamic random access memory in which data can be written and read on the user side are formed in the same manufacturing process. In addition, data can be read from these memories by using a common peripheral circuit.

What is claimed is:

1. A semiconductor memory having a random access memory (DRAM) and a mask read only memory (MROM) formed on the same semiconductor substrate; each of the DRAM and MROM comprising a plurality of word lines, a plurality of bit lines and a plurality of memory cells:

each of the memory cells included in the DRAM and the MROM comprising:

a switching element including source and drain regions and a gate electrode;

a capacitance element existing at least partially over the switching element and formed of an accumulation node electrode, an insulating film and a plate electrode subsequently laminated in this order, wherein, in a memory cell included in the DRAM, the switching element is connected to one of the word lines, to the capacitance element, and to one of the bit lines; and wherein, in a first memory cell included in the MROM which stores a first predetermined value, the switching element is connected to one of the word lines, to the capacitance element, and to one of the bit lines; and wherein, in a second memory cell included in the MROM which stores a second predetermined value, the switching element is disconnected from at least one of the following: a word line associated with the second memory cell, the capacitance element, and a bit line associated with the second memory cell.

2. A semiconductor memory according to claim 1, wherein the the first predetermined value is one and the second predetermined value is zero.

* * * * *